(12) United States Patent
Munetaka et al.

(10) Patent No.: US 11,985,812 B2
(45) Date of Patent: May 14, 2024

(54) SEMICONDUCTOR MEMORY DEVICE INCLUDING A TRENCH GATE STRUCTURE AND METHOD OF FORMING THE SAME

(71) Applicant: MICRON TECHNOLOGY, INC., Boise, ID (US)

(72) Inventors: Yuki Munetaka, Higashihiroshima (JP); Toshiyasu Fujimoto, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 17/203,543

(22) Filed: Mar. 16, 2021

(65) Prior Publication Data

US 2022/0302123 A1    Sep. 22, 2022

(51) Int. Cl.
*H10B 12/00* (2023.01)
*H01L 21/28* (2006.01)
*H01L 29/49* (2006.01)

(52) U.S. Cl.
CPC ....... *H10B 12/34* (2023.02); *H01L 21/28088* (2013.01); *H01L 29/4966* (2013.01); *H10B 12/053* (2023.02)

(58) Field of Classification Search
CPC ........... H01L 21/28088; H01L 29/4966; H01L 27/10823; H01L 27/10876; H01L 29/10891; H10B 12/053; H10B 12/34
USPC ........................................................ 257/330
See application file for complete search history.

(56) References Cited

U.S. PATENT DOCUMENTS

2017/0365608 A1* 12/2017 Lee .................... H01L 27/10852
2020/0381439 A1* 12/2020 Ikeda ................... H10B 12/482
2021/0082767 A1*  3/2021 Kim ...................... H10B 12/053

* cited by examiner

*Primary Examiner* — Hoai V Pham
(74) *Attorney, Agent, or Firm* — Dorsey & Whitney LLP

(57) ABSTRACT

An apparatus includes a semiconductor substrate; a line-shaped trench in the semiconductor substrate, an inner wall of the line-shaped trench being covered with an insulating film; a first conductive member including first and second line-shaped portions, the first line-shaped portion filling a lower portion of the line-shaped trench; and line-shaped second and third conductive members extending along the inner wall of the line-shaped trench and facing each other, the line-shaped second and third conductive members having a void therebetween; wherein the second line-shaped portion of the first conductive member protrudes from a central portion of the first line-shaped portion to fill the void.

13 Claims, 13 Drawing Sheets

SEMICONDUCTOR MEMORY DEVICE INCLUDING A TRENCH GATE STRUCTURE AND METHOD OF FORMING THE SAME

BACKGROUND

Recently, in semiconductor memory devices such as dynamic random access memory (hereinafter referred to as DRAM), a trench gate structure is being adopted as the structure of transistors in the memory cells. In word lines with a trench gate structure, a layered structure of titanium nitride (TiN) and polysilicon (poly-Si) is used in a lower portion of the trench. As higher densities of DRAM are pursued further, it is becoming necessary to lower the resistance of the gate electrodes.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, a semiconductor memory device and a method of forming the same according to the embodiment will be described with reference to FIGS. 1 to 13. In the following description, DRAM is given as an example of the semiconductor memory device. However, the dimensions and dimensional ratios of the units in the diagrams do not necessarily match the dimensions and dimensional ratios in an actual semiconductor device.

Figure 1:
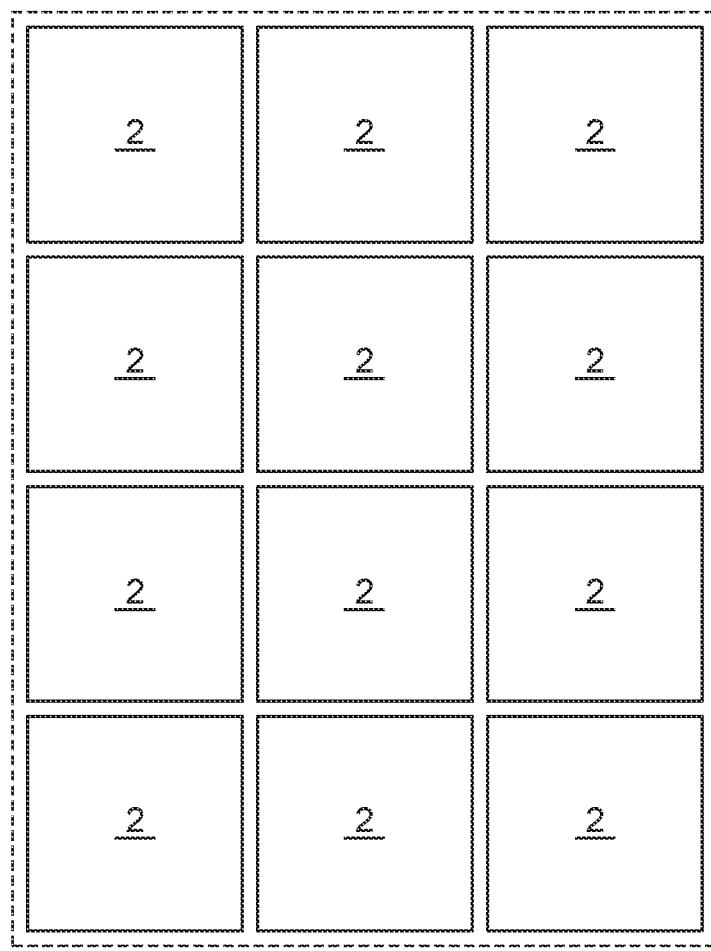
FIG. 1 is a plan view illustrating a schematic configuration of part of a memory cell region of a semiconductor memory device according to an embodiment.
Figure 2:
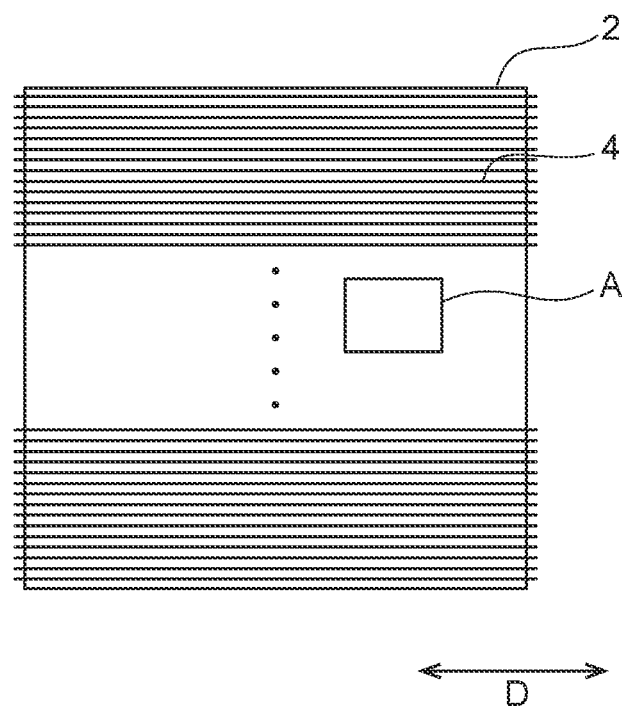
FIG. 2 is a plan view illustrating a schematic configuration of a memory mat of the semiconductor memory device according to the embodiment.

FIGS. 1 and 2 are diagrams illustrating plan-view layouts of the semiconductor memory device according to the embodiment. As illustrated in FIG. 1, the semiconductor memory device is provided with a plurality of memory mats 2. As illustrated in FIG. 2, in each of the memory mats 2, a plurality of word lines 4 are disposed in parallel, extending linearly in a predetermined direction. The end of each word line 4 is connected to a row decoder not illustrated. Herein, the direction parallel to the word lines 4 is designated the word line direction D.

Figure 3:
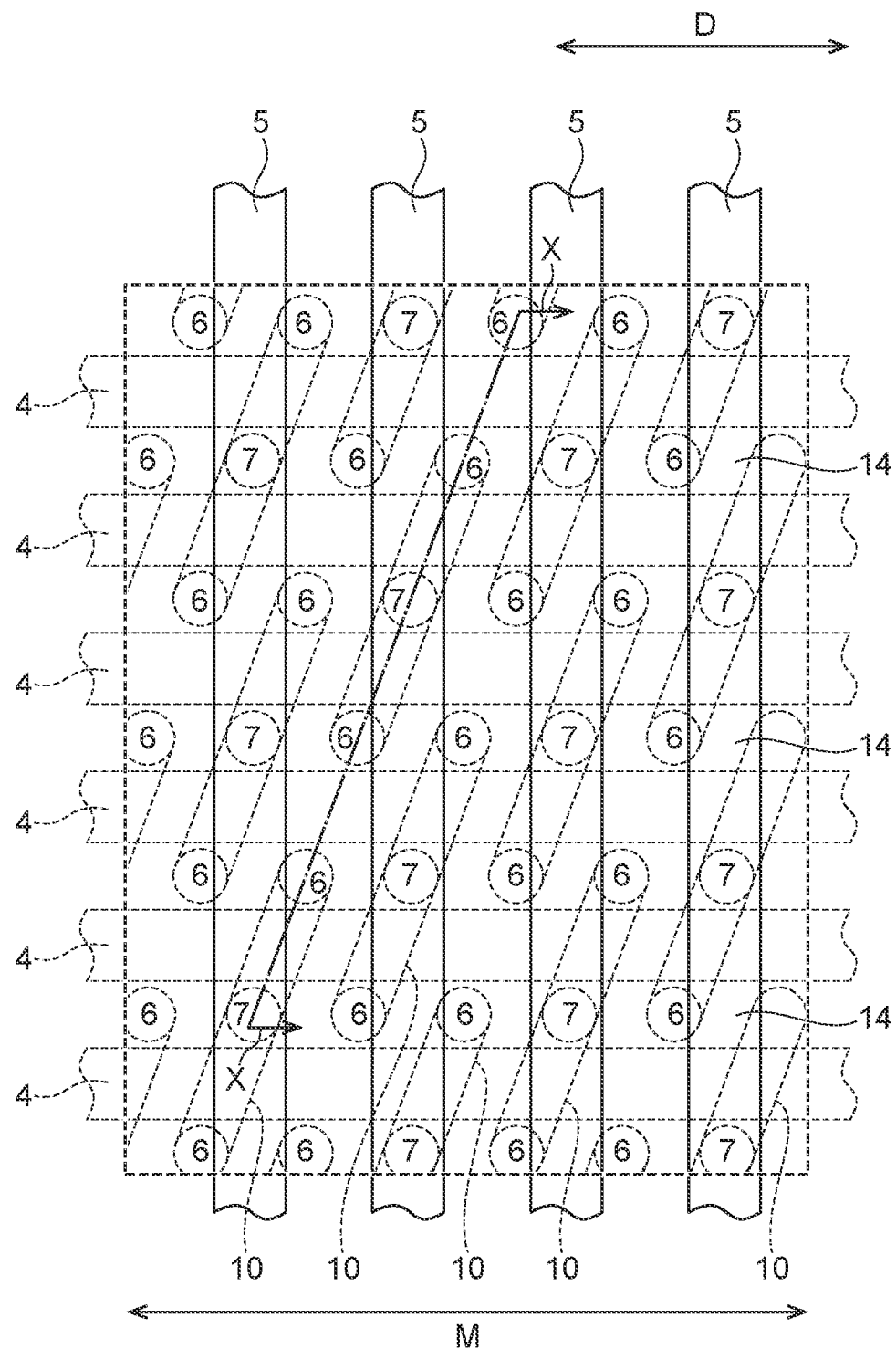
FIG. 3 is a plan-view layout illustrating a schematic configuration of a memory cell region of the semiconductor memory device according to the embodiment.

FIG. 3 is a layout diagram illustrating an enlarged view of the memory mat region A of the memory mat 2 illustrated in FIG. 2. As illustrated in FIG. 3, in the memory mat region A, the semiconductor memory device is provided with a memory cell region M. In the memory cell region M, a plurality of word lines 4 and a plurality of bit lines 5 are disposed orthogonally at equal pitch. A plurality of island-shaped active regions 10 forming memory cells are disposed at the intersection points between the word lines 4 and the bit lines 5. The active regions 10 are surrounded by isolation regions 14 that electrically isolate elements from each other.

The longitudinal direction of the active regions 10 is inclined a predetermined angle with respect to the bit lines 5. The word lines 4 function as the gate electrode of an access transistor of the memory cells in the active regions 10. The bit lines 5 are connected to a central portion of the active regions 10 through bit line contacts 7. In the active regions 10, capacitor contacts 6 are disposed on the opposite side of the word lines 4 from the bit line contacts 7. Capacitors not illustrated are connected to the capacitor contacts 6.

Next, FIGS. 4 to 11 will be referenced to describe a semiconductor memory device and a method of forming the same according to the embodiment.

Figure 4:
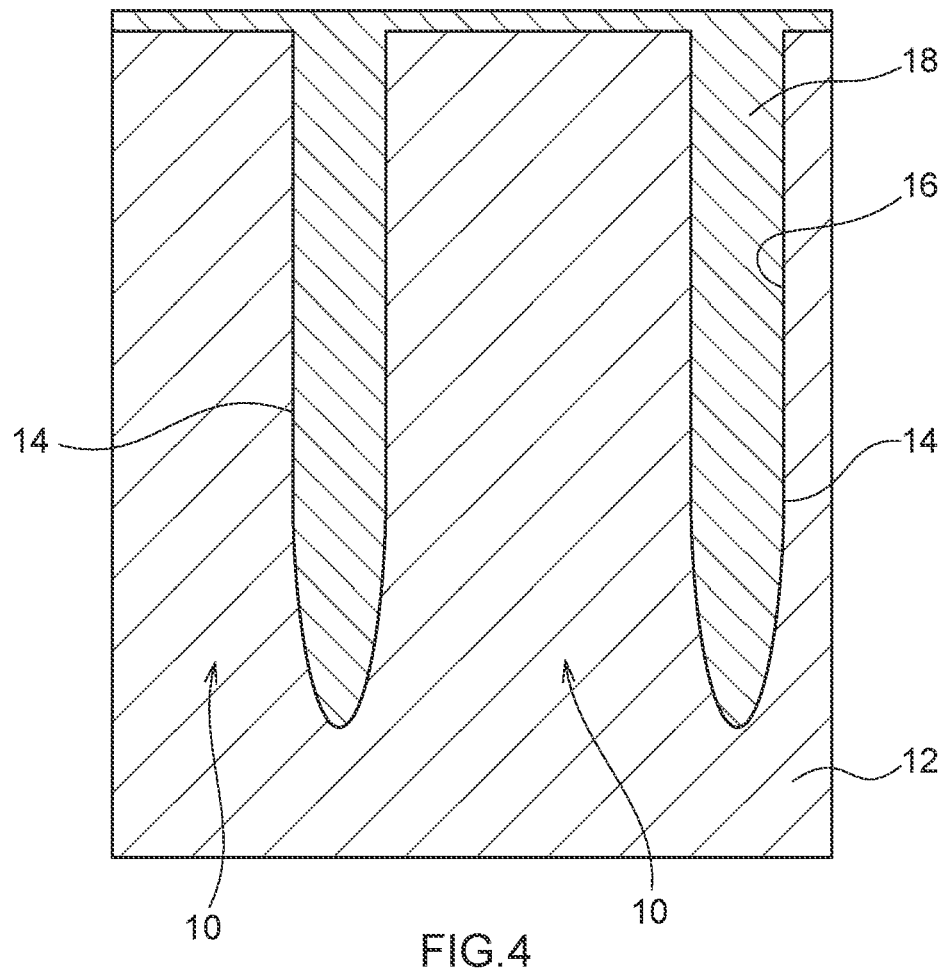
FIG. 4 is a diagram illustrating a method of forming the semiconductor memory device according to the embodiment, and is a longitudinal section illustrating a schematic configuration of a memory cell region in an exemplary process stage, namely, a longitudinal section illustrating a schematic configuration of the portion along the line X-X in FIG. 3.

As illustrated in FIG. 4, the isolation regions 14 are formed on a semiconductor substrate 12. The active regions 10 are demarcated by the isolation regions 14. In each isolation region 14, a shallow trench isolation containing an insulating film embedded in a trench formed in the semiconductor substrate 12 is formed, for example.

Each isolation region 14 is formed by forming a trench 16 in the semiconductor substrate 12 using known lithography technology and anisotropic dry etching technology, and embedding an insulating film 18 such as a silicon oxide film for example inside the trench 16. The insulating film 18 is formed by chemical vapor deposition (hereinafter referred to as CVD), for example.

Figure 5:
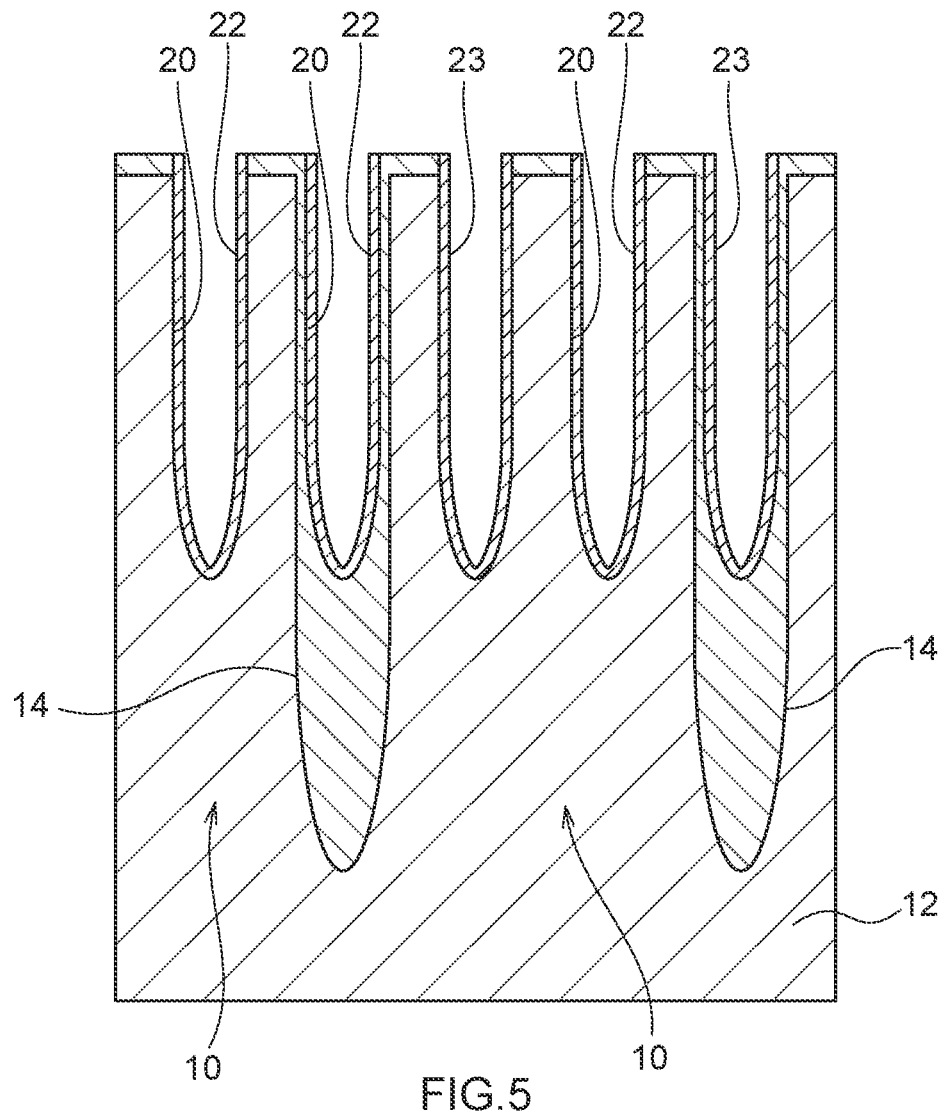
FIG. 5 is a diagram illustrating a method of forming the semiconductor memory device according to the embodiment, and is a longitudinal section illustrating a schematic configuration of a memory cell region in an exemplary process stage following FIG. 4, namely, a longitudinal section illustrating a schematic configuration of the portion along the line X-X in FIG. 3.

Next, as illustrated in FIG. 5, trenches 20 for forming the word lines later are formed in the semiconductor substrate 12. The trenches 20 are formed by etching the semiconductor substrate 12 using lithography technology and anisotropic dry etching technology. As described later, the trenches 20 are line-shaped trenches in which conductive material is embedded to form the word lines 4, and extend linearly in a predetermined direction similarly to the word lines 4. Each trench 20 has a U-shaped cross section provided with a pair of vertical inner sides as viewed in a longitudinal section. The trenches 20 cut through the active region 10. Thereafter, a gate insulating film 22 is formed on the surface of the trenches 20. The gate insulating film 22 contains an insulating film such as silicon dioxide ($SiO_2$) for example. The gate insulating film 22 is formed by CVD, for example. The surface of the gate insulating film 22 acts as an inner wall 23 of each trench 20.

Figure 6:
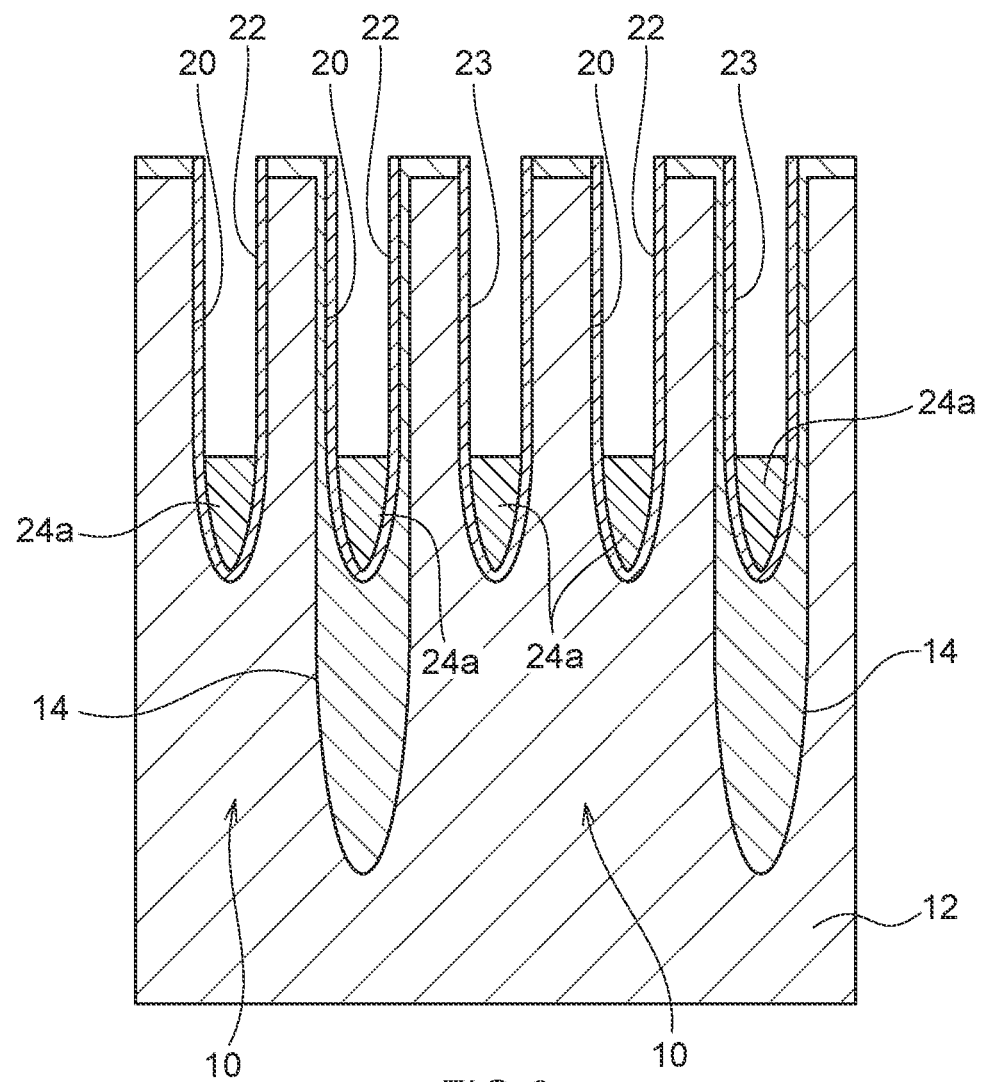
FIG. 6 is a diagram illustrating a method of forming the semiconductor memory device according to the embodiment, and is a longitudinal section illustrating a schematic configuration of a memory cell region in an exemplary process stage following FIG. 5, namely, a longitudinal section illustrating a schematic configuration of the portion along the line X-X in FIG. 3.

Next, as illustrated in FIG. 6, a first part 24a is formed so as to fill a lower portion of each trench 20. The first part 24a contains a first conductive material, the first conductive material being a metallic compound such as titanium nitride (TiN), for example. The first part 24a is formed as follows, for example. The first conductive material containing titanium nitride is deposited by CVD so as to fill the trenches 20. Next, the first conductive material is etched back by performing anisotropic dry etching, causing the first conductive material to remain in a lower portion of the trenches 20. With this arrangement, the first parts 24a can be formed in a line shape along the inner wall 23 of each trench 20. The amount of etchback of the first conductive material, or in other words the position of the top face of the first part 24a, is controlled by controlling the duration of the anisotropic dry etching, for example.

Figure 7:
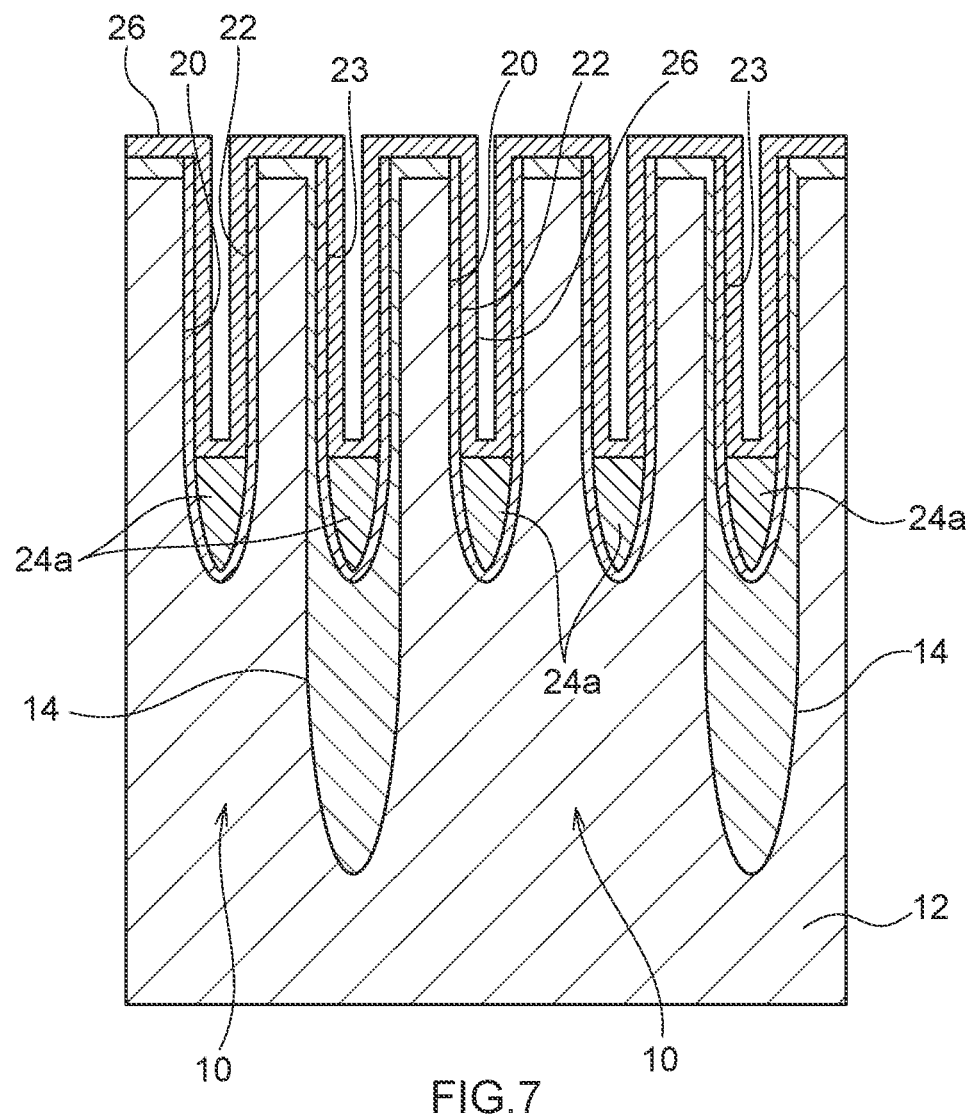
FIG. 7 is a diagram illustrating a method of forming the semiconductor memory device according to the embodiment, and is a longitudinal section illustrating a schematic configuration of a memory cell region in an exemplary process stage following FIG. 6, namely, a longitudinal section illustrating a schematic configuration of the portion along the line X-X in FIG. 3.

Next, as illustrated in FIG. 7, a second conductive film 26 is deposited on the side walls of the inner wall 23 of each trench 20 as well as on the top face of the semiconductor substrate 12, the second conductive film 26 not being formed thick enough to fill the trenches 20. The second conductive film 26 is formed by CVD, for example. The second conductive film 26 contains a second conductive material such as polysilicon, for example. The polysilicon may be doped with an impurity such as phosphorus, arsenic, or boron. In the present embodiment, a work function of the first conductive material (first work function) is larger than a work function of the second conductive material (second work function). Also, the resistance value of the first conductive material is smaller than the resistance value of the second conductive material.

Figure 8:
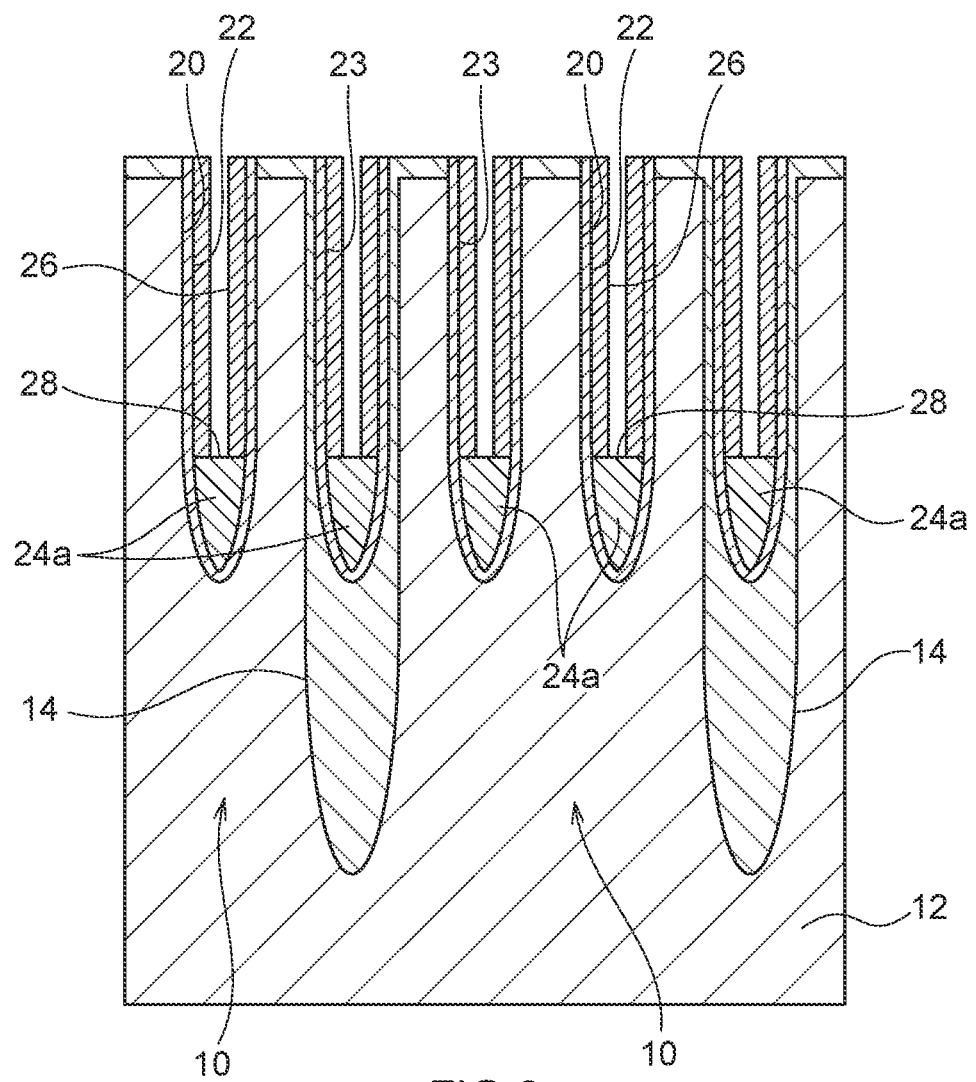
FIG. 8 is a diagram illustrating a method of forming the semiconductor memory device according to the embodiment, and is a longitudinal section illustrating a schematic configuration of a memory cell region in an exemplary process stage following FIG. 7, namely, a longitudinal section illustrating a schematic configuration of the portion along the line X-X in FIG. 3.

Next, as illustrated in FIG. 8, the second conductive film 26 is etched back by performing anisotropic dry etching on the deposited second conductive film 26. The second conductive film 26 is etched back enough to remove the second conductive film 26 on the top face of the gate insulating film 22 and form openings 28 exposing a portion of the top face of each first part 24a. The second conductive film 26 remaining after the etchback acts as two line-shaped plate members provided along each inner wall 23. A void or gap is formed between the two plate members.

Figure 9:
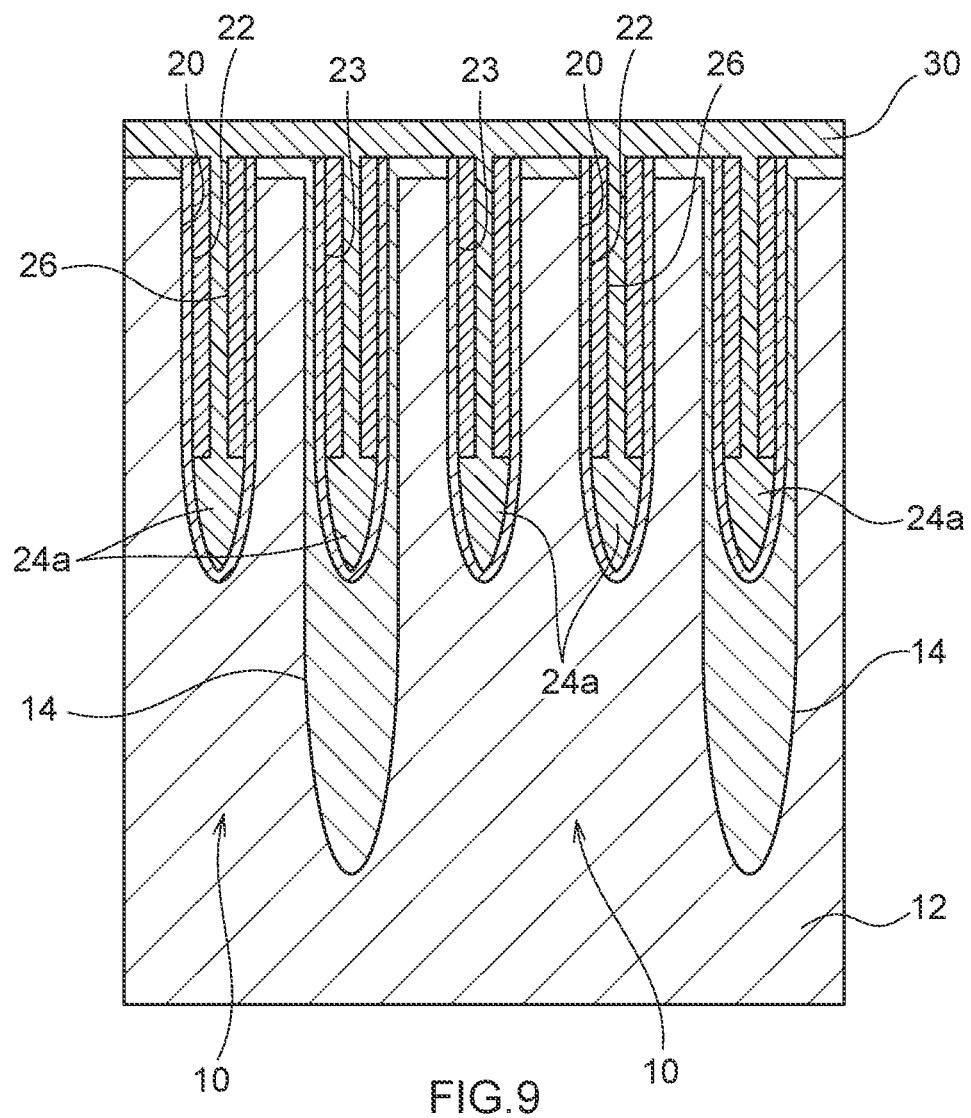
FIG. 9 is a diagram illustrating a method of forming the semiconductor memory device according to the embodiment, and is a longitudinal section illustrating a schematic configuration of a memory cell region in an exemplary process stage following FIG. 8, namely, a longitudinal section illustrating a schematic configuration of the portion along the line X-X in FIG. 3.

Thereafter, as illustrated in FIG. 9, a third conductive film 30 is deposited to fill the trenches 20 in which the second conductive film 26 is formed. The third conductive film 30 is formed by CVD, for example. The third conductive film 30 contains a conductive material, which may be the first conductive material containing a metallic compound such as titanium nitride (TiN), for example. The void or gap between the two plate members is filled by the third conductive film 30. The third conductive film 30 directly contacts the top portion of the first parts 24a through the openings 28 in the second conductive film 26.

Figure 10:
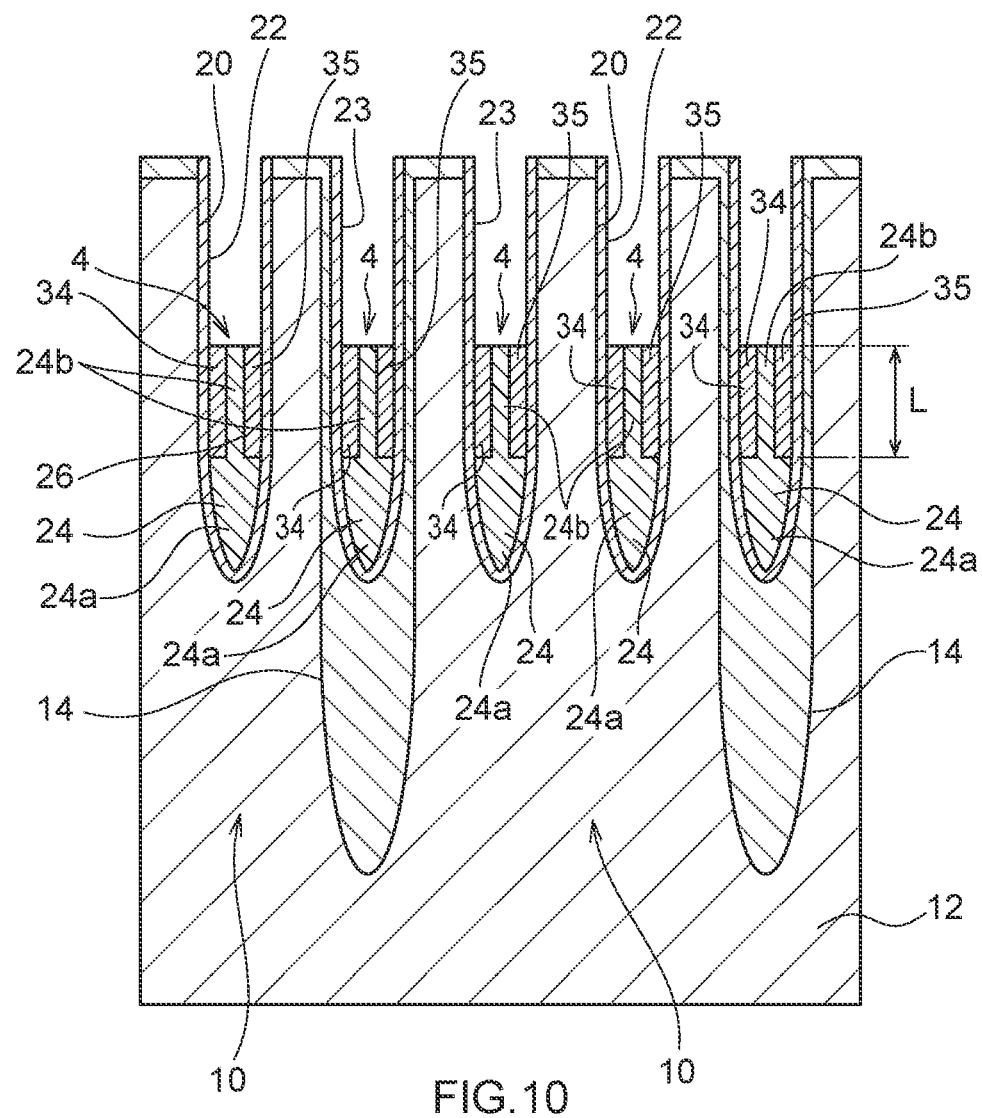
FIG. 10 is a diagram illustrating a method of forming the semiconductor memory device according to the embodiment, and is a longitudinal section illustrating a schematic configuration of a memory cell region in an exemplary process stage following FIG. 9, namely, a longitudinal section illustrating a schematic configuration of the portion along the line X-X in FIG. 3.

Next, as illustrated in FIG. 10, anisotropic dry etching is performed on the deposited third conductive film 30 and second conductive film 26. At this time, etching is performed under etching conditions such that the etch rate of the third conductive film 30 and the etch rate of the second conductive film 26 are substantially the same. With this arrangement, the third conductive film 30 and the second conductive film 26 are etched back while substantially maintaining the same top face. The etchback of the third conductive film 30 and the second conductive film 26 causes the height of the third conductive film 30 and the second conductive film 26 inside the trenches 20 to be lowered, clearing a space of an upper portion of the trenches 20. With this arrangement, a line-shaped second part 24b, a line-shaped second conductive member 34, and a line-shaped third conductive member 35 remain. The first part 24a and the second part 24b unify to form the first conductive member 24. The amount of etchback achieved by this etching is controlled such that a vertical dimension L of the second part 24b, the second conductive member 34, and the third conductive member 35 shown in FIG. 10 is a predetermined dimension. The amount by which the third conductive film 30 and the second conductive film 26 are etched back is controlled by controlling the duration of the anisotropic dry etching, for example.

Through the above steps, word lines 4 provided with the first conductive member 24, the second conductive member 34, and the third conductive member 35 are formed. The second conductive member 34 and the third conductive member 35 are disposed in parallel facing each other. A void or gap exists between the second conductive member 34 and the third conductive member 35. The second part 24b is provided to fill the void or gap. The second conductive member 34 and the third conductive member 35 are disposed so as to sandwich the second part 24b therebetween.

The second conductive member 34 and the third conductive member 35 include a portion of the second conductive film 26 illustrated in FIG. 9. The first conductive member 24 is provided with the first part 24a and the second part 24b. The second part 24b includes a portion of the third conductive film 30 illustrated in FIG. 9. The second part 24b is connected to the first part 24a, and is formed to protrude from the top face of a central portion of the first part 24a. The first conductive member 24 contains the first conductive material, while the second conductive member 34 and the third conductive member 35 contain the second conductive material. Consequently, the work function of the first conductive member 24 (first work function) is larger than the work function of the second conductive member 34 and the third conductive member 35 (second work function).

Figure 11:
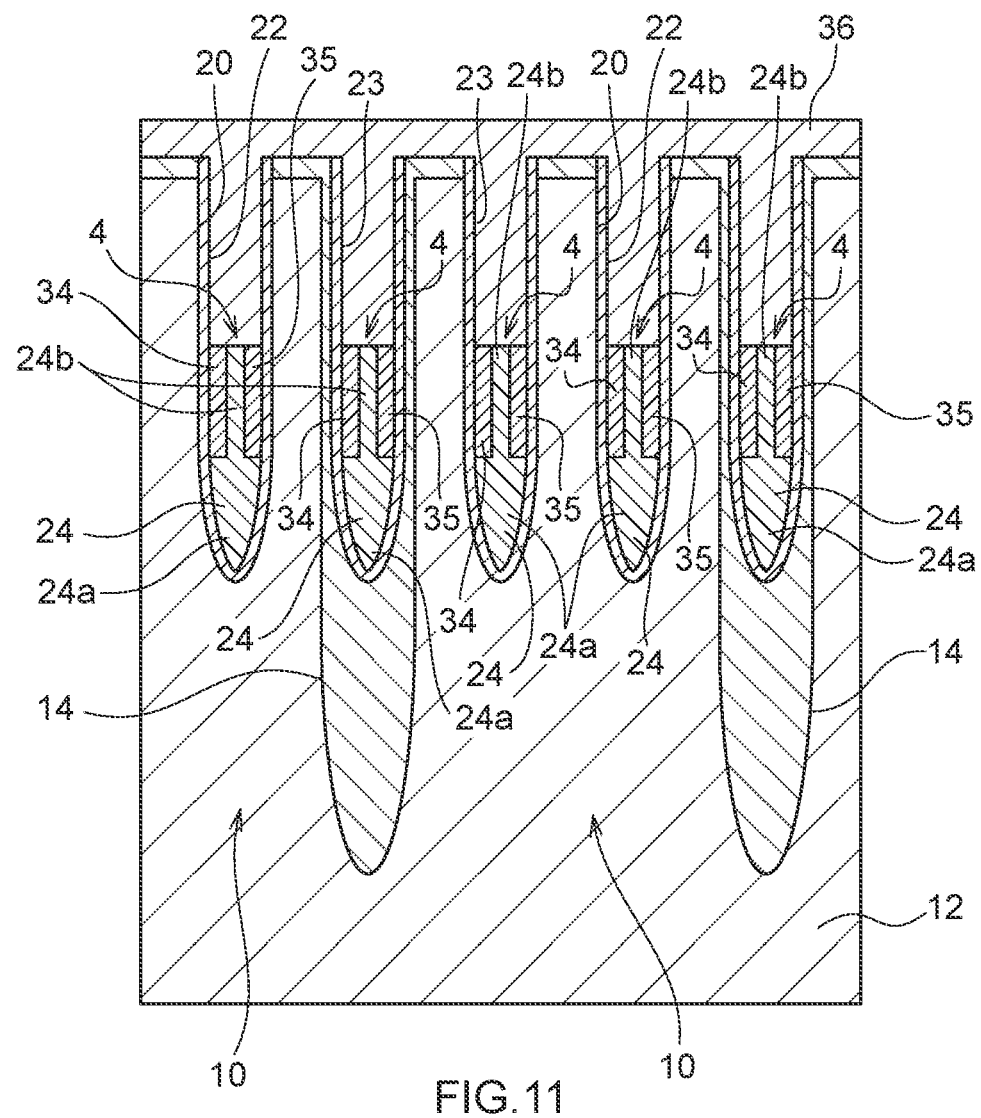
FIG. 11 is a diagram illustrating a method of forming the semiconductor memory device according to the embodiment, and is a longitudinal section illustrating a schematic configuration of a memory cell region in an exemplary process stage following FIG. 10, namely, a longitudinal section illustrating a schematic configuration of the portion along the line X-X in FIG. 3.

Next, as illustrated in FIG. 11, a cap fill layer 36 is deposited to fill the trench 20 and cover the top face of the semiconductor substrate 12. The cap fill layer 36 contains an insulating film such as silicon dioxide, for example. The cap fill layer 36 is formed by CVD, for example. After depositing the cap fill layer 36, a step of flattening the surface by using chemical mechanical polishing technology may also be performed. Through the above steps, the semiconductor memory device according to the embodiment can be formed.

Figure 12:
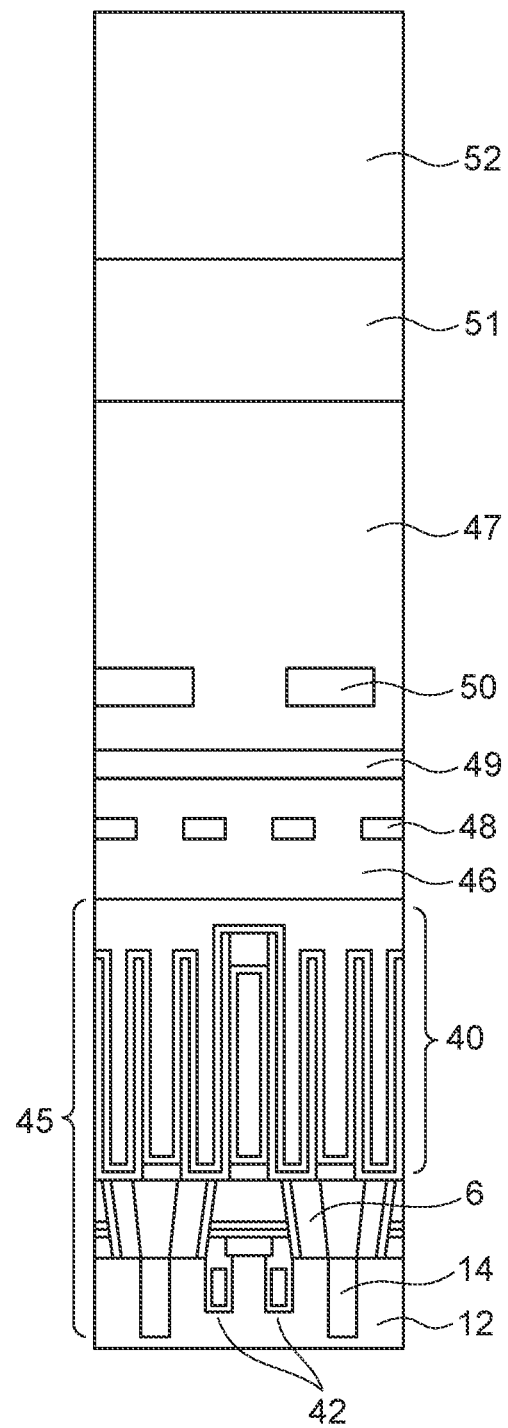
FIG. 12 is a longitudinal section illustrating one example of an overall schematic configuration of a memory cell region in the semiconductor memory device according to the embodiment.

FIG. 12 is a longitudinal section illustrating one example of an overall schematic configuration of a memory cell region in the semiconductor memory device according to the embodiment. As illustrated in FIG. 12, capacitors 40 are provided above the semiconductor substrate 12 on which components such as the isolation regions 14 and access transistors 42 are provided. Lower electrodes of the capacitors 40 are electrically connected, through the capacitor contacts 6, to one side of a source-drain region of the access transistors 42 formed in the active regions 10 of the semiconductor substrate 12. Memory cells 45 are provided on the semiconductor substrate 12 and include components such as the isolation regions 14, the access transistors 42, the capacitor contacts 6, and the capacitors 40.

In addition, multilevel wiring layers containing components such as interconnects 48, 49, 50, and 51 are provided above the capacitors 40. In other words, upper electrodes of the capacitors 40 are disposed near the multilevel wiring layers containing components such as the interconnects 48, 49, 50, and 51. Components 46, 47, and 52 illustrated in FIG. 12 contain insulating films. The components 40 to 52 described above are formed on top of the semiconductor substrate 12 illustrated in FIG. 11.

Figure 13:
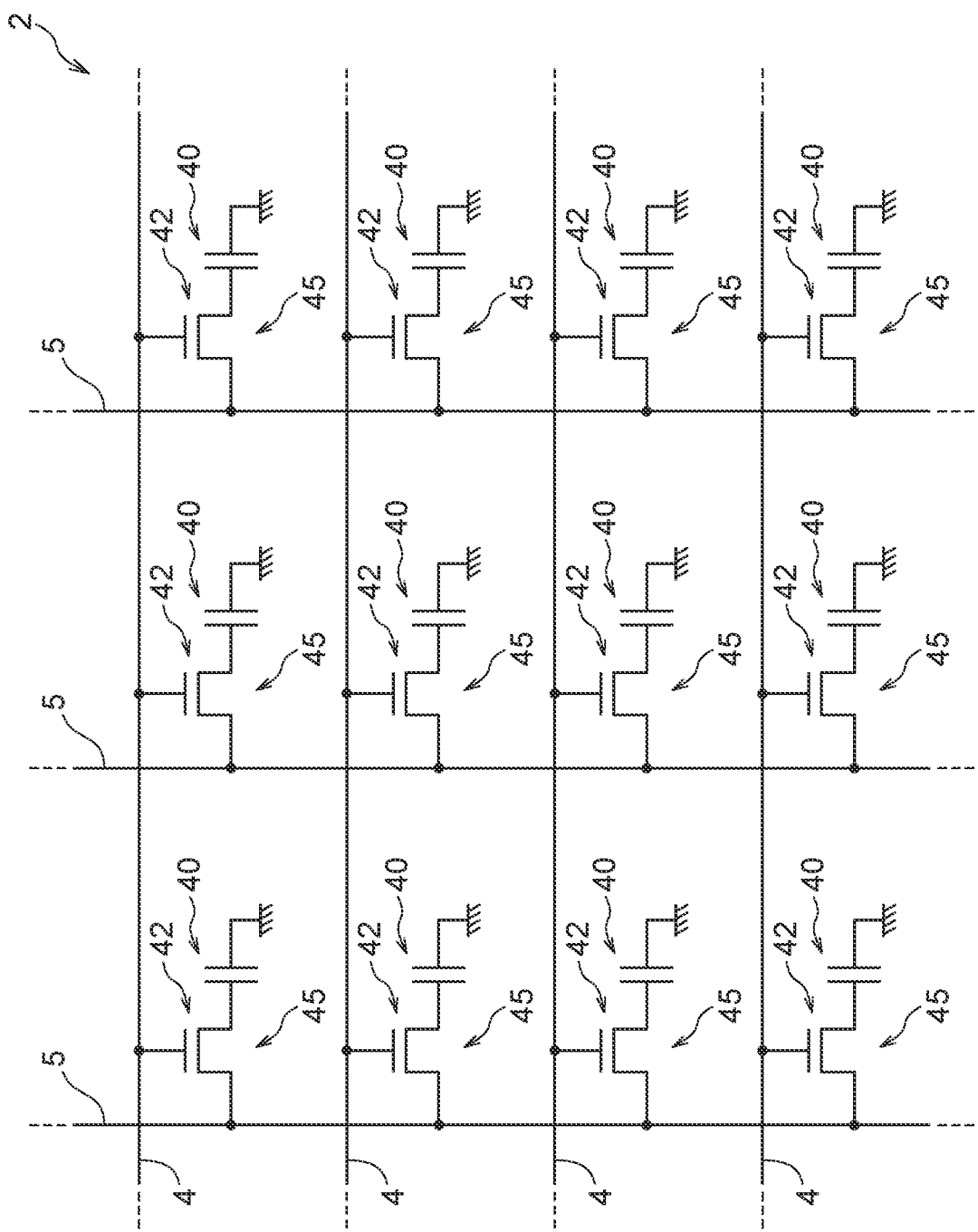
FIG. 13 is a circuit diagram illustrating a schematic configuration of an equivalent circuit of memory cells of the semiconductor memory device according to the embodiment.

Also, FIG. 13 illustrates an equivalent circuit of a memory cell array in the memory mat 2 of the semiconductor memory device according to the embodiment. A plurality of memory cells 45 are arranged in a matrix, with each memory cell 45 being connected to an intersection point between the plurality of word lines 4 and the plurality of bit lines 5 disposed in straight lines. A single memory cell 45 includes a pair of an access transistor 42 and a capacitor 40. The access transistor 42 includes a metal-oxide-semiconductor field-effect transistor (MOSFET), for example. The gate electrode of the access transistor 42 functions as a DRAM word line 4. The word line 4 functions as a control line that controls the selection of the corresponding memory cell. One of the source and the drain of the access transistor 42 is connected to one of the bit lines 5, while the other is connected to the capacitor 40. The capacitor 40 includes a capacitor and stores data by holding accumulated charge.

When writing data to one of the memory cells 45, a potential that turns on the access transistor 42 is applied to the word line 4, while a low potential or a high potential corresponding to "0" or "1" of the data to write is applied to the bit line 5. When reading out data from one of the memory cells 45, a potential that turns on the access transistor 42 is applied to the word line 4, and a data determination is made by having a sense amplifier connected to the bit line 5 sense the potential drawn out from the capacitor 40 to the bit line 5.

According to the semiconductor memory device and a method of forming the same according to the embodiment, the first part 24a, the second conductive member 34, the third conductive member 35, and the second part 24b sandwiched between the second conductive member 34 and the third conductive member 35 are formed in a lower portion of the trenches 20 in the word lines 4 having a trench gate structure. By controlling the amount by which the first conductive member 24 is etched back, the position of the boundary between the first part 24a and the second and third conductive members 34 and 35 can be controlled. Furthermore, by controlling the amount of etchback, the vertical dimension L of the second part 24b, the second conductive member 34, and the third conductive member 35 as well as the position of the top face of the first part 24a can be controlled. According to this configuration, by adjusting the position of the boundary between the first part 24a of the first conductive member 24 and the second and third conductive members 34 and 35, and by adjusting the dimension L, the refresh and row hammer characteristics can be improved while also restraining an increase in the gate-induced drain leakage (GIDL). In addition, the resistance value of the first conductive member 24 can be lowered.

At this point, the GIDL, refresh characteristics, and row hammer will be described. With regard to the refresh characteristics, if the GIDL becomes large, it may not be possible to set a long refresh interval in some cases. Also, if a word line is repeatedly turned on/off in succession (that is, hammered) while the access transistor is on, a channel may form in the active silicon on the side of the word line, and electron migration from the capacitor to this channel may occur in some cases. When the access transistor is off, a majority of the electrons return to the original capacitor before the channel vanishes, but in some cases, some electrons may be lost by recombining with holes in the channel or becoming trapped in defects. As a result, the potential of the capacitor may fluctuate between multiple instances of hammering, and the high/low potential of the cell may no longer be sensed correctly.

In the present embodiment, if the position of the boundary between the first conductive member 24 and the second and third conductive members 34 and 35 is lowered, or in other words, if the position of the top face of the first part 24a is lowered, the GIDL can be reduced, but the resistance value of the first conductive member 24 increases, and therefore the resistance value of the word line 4 increases. If the position of the top face of the first part 24a is raised, the resistance value of the first conductive member 24 can be decreased, but the GIDL increases. In the semiconductor memory device and method of forming the same according to the embodiment, the position of the boundary between the first part 24a of the first conductive member 24 and the second and third conductive members 34 and 35 can be adjusted to decrease the resistance value of the word line while also restraining an increase in the GIDL.

In the embodiment, the first part 24a of the first conductive member 24 having a large work function is disposed in the lower portion along the sides of the inner wall 23 of each trench 20, while the second conductive member 34 and the third conductive member 35 having a small work function are disposed on top of the first part 24*a*. With this arrangement, the row hammer characteristics are improved by increasing the number of electrons that return to the capacitor. If the position of the top face of the first part 24*a* is lowered, the number of electrons returning to the capacitor increases. Consequently, the position of the top face of the first part 24*a* is lowered to improve the row hammer characteristics.

In the embodiment, the second part 24*b* having a small resistance value can also be disposed between the second conductive member 34 and the third conductive member 35, and the cross-sectional area of the first conductive member 24 can be increased. With this arrangement, the resistance value of the first conductive member 24 can be decreased, thereby decreasing the resistance value of the word line 4. Also, according to the embodiment, the resistance value of the first conductive member 24 can be decreased without raising the position of the boundary between the first conductive member 24 and the second and third conductive members 34 and 35 lowered, or in other words, without raising the position of the top face of the first part 24*a*. Consequently, the resistance value of the word line 4 can be decreased while also restraining an increase in the GIDL of the memory cell transistor and furthermore improving the refresh characteristics and the row hammer characteristics. With this arrangement, the data retention characteristics of DRAM can be improved while also pursuing higher densities, thereby achieving higher-performance DRAM.

As above, DRAM is described as an example of the semiconductor memory device according to the embodiment, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor memory device.

Also, in the semiconductor memory devices according to the embodiment, the materials of the first conductive material and the second conductive material may be selected from among any of various types of electrical conducting materials having work functions as described above, or in other words, having work functions that satisfy the following relationship:

work function of first conductive material (first work function)>work function of second conductive material (second work function).

For the first conductive material and the second conductive material, a semiconductor, a metal, or a compound containing either or both may be selected. For example, a combination of materials having work functions that satisfy the relationship as described above may be selected from among cobalt (Co), nickel (Ni), platinum (Pt), titanium (Ti), magnesium (Mg), tungsten (W), tantalum (Ta), hafnium (Hf), silicon (Si), or a compound or metallic compound containing any of the above as the first conductive material and the second conductive material. Examples of metallic compounds include titanium nitride (TiN) and tungsten nitride (WN).

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a semiconductor substrate;
   an isolation region in the semiconductor substrate;
   a first portion of a line-shaped trench in the semiconductor substrate, an inner wall of the line-shaped trench being covered with an insulating film,
   a second portion of the line-shaped trench in the isolation region;
   a first conductive member including first and second line-shaped portions, the first line-shaped portion filling a lower portion of the line-shaped trench;
   line-shaped second and third conductive members extending along the inner wall of the line-shaped trench and are disposed in parallel facing each other, the line-shaped second and third conductive members having a void therebetween; and
   a cap fill layer deposited to fill the line-shaped trench and cover a top face of the semiconductor substrate,
   wherein the second line-shaped portion of the first conductive member protrudes from a central portion of the first line-shaped portion to fill the void, and
   wherein the cap fill layer covers the second line-shaped portion, the line-shaped second conductive member, and the line-shaped third conductive member.

2. The apparatus of claim 1, wherein a first work function of the first conductive member is larger than a second work function of the line-shaped second and third conductive members.

3. The apparatus of claim 1, wherein a first resistance value of the first conductive member is smaller than a second resistance value of the line-shaped second and third conductive members.

4. The apparatus of claim 1, wherein the first conductive member comprises titanium nitride.

5. The apparatus of claim 1, wherein the line-shaped second and third conductive members comprise silicon.

6. The apparatus of claim 1, wherein the line-shaped trench extends linearly in a predetermined direction.

7. The apparatus of claim 1, wherein the line-shaped second conductive member and line-shaped third conductive member are disposed on top of the first line-shaped portion, and wherein the line-shaped second conductive member and line-shaped third conductive member are disposed directly on the insulating film covering respective portions of the inner walls of the line-shaped trench.

8. An apparatus comprising:
   a semiconductor substrate;
   an isolation region in the semiconductor substrate;
   a line-shaped trench in the semiconductor substrate, an inner wall of the line-shaped trench being covered with an insulating film;
   a first conductive member including first and second line-shaped portions, the first line-shaped portion filling a lower portion of the line-shaped trench, and the second line-shaped portion protruding from a central upper surface of the first line-shaped portion;

a line-shaped second conductive member extending between a portion of the inner wall of the line-shaped trench and the second line-shaped portion of the first conductive member;

a line-shaped third conductive member extending between another portion of the inner wall of the line-shaped trench and the second line-shaped portion of the first conductive member; and a cap fill layer deposited to fill the line-shaped trench and cover a top face of the semiconductor substrate, wherein the line-shaped second conductive member and the line-shaped third conductive member are disposed in parallel facing each other, wherein a material of the isolation region covers a top surface of the semiconductor substrate between neighboring portions of the line-shaped trench, and wherein the cap fill layer covers the second line-shaped portion, the line-shaped second conductive member, and the line-shaped third conductive member.

9. The apparatus of claim 8, wherein a first work function of the first conductive member is larger than a second work function of the line-shaped second and third conductive members.

10. The apparatus of claim 8, wherein a first resistance value of the first conductive member is smaller than a second resistance value of the line-shaped second and third conductive members.

11. The apparatus of claim 8, wherein the first conductive member comprises titanium nitride.

12. The apparatus of claim 8, wherein the line-shaped second and third conductive members comprise silicon.

13. The apparatus of claim 8, wherein the line-shaped trench extends linearly in a predetermined direction.

* * * * *